United States Patent
Ngai et al.

(10) Patent No.: US 7,080,195 B2
(45) Date of Patent: Jul. 18, 2006

(54) MERGING INDICATIONS OF MATCHING ITEMS OF MULTIPLE GROUPS AND POSSIBLY ASSOCIATED WITH SKIP CONDITIONS TO IDENTIFY WINNING ENTRIES OF PARTICULAR USE FOR IMPLEMENTING ACCESS CONTROL LISTS

(75) Inventors: Philip Ngai, Fremont, CA (US); Monica Joshi, San Jose, CA (US); David Michael Thornburg, San Jose, CA (US); Hyesook Lim, Seoul (KR)

(73) Assignee: Cisco Technology, Inc., San Jose, CA (US)

( * ) Notice: Subject to any disclaimer, the term of this patent is extended or adjusted under 35 U.S.C. 154(b) by 300 days.

(21) Appl. No.: 10/691,401

(22) Filed: Oct. 22, 2003

(65) Prior Publication Data

US 2005/0114602 A1 May 26, 2005

(51) Int. Cl.
*G06F 13/00* (2006.01)

(52) U.S. Cl. ........................................ 711/108; 711/158

(58) Field of Classification Search .................... None
See application file for complete search history.

(56) References Cited

U.S. PATENT DOCUMENTS

| | | | |
|---|---|---|---|
| 5,291,491 A | 3/1994 | Hutchison et al. | |
| 5,748,905 A | 5/1998 | Hauser et al. | |
| 6,295,576 B1 | 9/2001 | Ogura et al. | |
| 6,317,350 B1 | 11/2001 | Pereira et al. | |
| 6,374,326 B1 | 4/2002 | Kansal et al. | |
| 6,385,071 B1* | 5/2002 | Chai et al. ................. | 365/49 |
| 6,389,506 B1 | 5/2002 | Ross et al. | |
| 6,526,474 B1 | 2/2003 | Ross | |
| 6,535,951 B1 | 3/2003 | Ross | |
| 6,546,391 B1 | 4/2003 | Tsuruoka | |
| 6,564,289 B1* | 5/2003 | Srinivasan et al. ......... | 711/108 |
| 6,597,595 B1* | 7/2003 | Ichiriu et al. .................. | 365/49 |
| 6,606,681 B1 | 8/2003 | Uzun | |
| 6,658,002 B1 | 12/2003 | Ross et al. | |
| 6,678,786 B1* | 1/2004 | Srinivasan et al. ......... | 711/108 |
| 6,707,692 B1 | 3/2004 | Hata | |
| 6,715,029 B1 | 3/2004 | Trainin et al. | |
| 6,717,946 B1 | 4/2004 | Hariguchi et al. | |

(Continued)

OTHER PUBLICATIONS

Structured Computer Organization $2^{nd}$ ed., Tanenbaum, 1984 p. 11.*

(Continued)

*Primary Examiner*—Reginald G. Bragdon
*Assistant Examiner*—Horace L. Flournoy
(74) *Attorney, Agent, or Firm*—The Law Office of Kirk D. Williams

(57) ABSTRACT

Disclosed are, inter alia, methods, apparatus, data structures, computer-readable medium, mechanisms, and means for merging indications of matching items of multiple groups and possibly associated with skip conditions to identify winning entries of particular use for implementing access control lists. Indications are received typically from an associative memory bank indicating which locations were matched during a lookup operation. Each of the entries is typically associated with one or more hierarchical groups and a skip or no-skip condition. The matching entries are merged to identify one or more wining entries, these being matching entries not in a group that is skipped. A group is typically skipped if the highest priority matching entry of the particular group is associated with a skip condition. A priority encoder can be used to identify a single highest priority winning entry from the winning entries.

20 Claims, 12 Drawing Sheets

U.S. PATENT DOCUMENTS

| | | |
|---|---|---|
| 6,738,862 B1 | 5/2004 | Ross et al. |
| 6,763,426 B1 | 7/2004 | James et al. |
| 6,871,262 B1 | 3/2005 | Oren et al. |
| 6,871,265 B1 | 3/2005 | Oren et al. |
| 2001/0038554 A1 | 11/2001 | Takata et al. |
| 2002/0075714 A1 | 6/2002 | Pereira et al. |
| 2003/0005146 A1* | 1/2003 | Miller et al. ............... 709/238 |
| 2003/0223259 A1 | 12/2003 | Roth |
| 2003/0231631 A1 | 12/2003 | Pullela |
| 2004/0015752 A1 | 1/2004 | Patella et al. |
| 2004/0030802 A1 | 2/2004 | Eatherton et al. |
| 2004/0030803 A1 | 2/2004 | Eatherton et al. |
| 2004/0170172 A1 | 9/2004 | Pullela et al. |

OTHER PUBLICATIONS

U.S. Appl. No. 10/215,719, filed Aug. 10, 2002, Eatherton et al.

U.S. Appl. No. 10/215,700, filed Aug. 10, 2002, Eatherton et al.

U.S. Appl. No. 10/630,176, filed Jul. 29, 2003, Pullela et al.

CAMTN and CAMTR—Ternary Content Addressable Memory, ASIC Products, Cu-11, Jun. 19, 2002, pp. 223-242, IBM.

* cited by examiner

EXEMPLARY
MERGING LOGIC
EQUATIONS
460

MASK_L1[0] = MATCH[0] * SKIP_L1[0]
MASK_L1[1] = MATCH[1] * SKIP_L1[1] + ~START_L1[1] * MASK_L1[0]
MASK_L1[2] = MATCH[2] * SKIP_L1[2] + ~START_L1[2] * MASK_L1[1]
...
MASK_L2[0] = MATCH[0] * SKIP_L2[0]
MASK_L2[1] = MATCH[1] * SKIP_L2[1] * ~MASK_L1[1] + ~START_L2[1] * MASK_L2[0]
MASK_L2[2] = MATCH[2] * SKIP_L2[2] * ~MASK_L1[2] + ~START_L2[2] * MASK_L2[1]
...

EXEMPLARY
MERGING LOGIC
EQUATIONS
530

INPUTS:
CONFIGURATION:
STARTL1-A, STARTL1-B, STARTL1-C, STARTL1-D
STARTL2-A, STARTL2-B, STARTL2-C, STARTL2-D
SKIPL1-A, SKIPL1-B, SKIPL1-C, SKIPL1-D
ASSOCIATIVE MEMORY: MATCH-A, MATCH-B, MATCH-C, MATCH-D

LEVEL ONE LOOK AHEAD
SKIPAtmp = (SKIPL1-A and MATCH-A and not STARTL1-B)
SKIPL1-OUT = (SKIPL1-B and MATCH-B) or SKIPAtmp
STARTL1-OUT = STARTL1-B or STARTL1-A

LEVEL TWO LOOK AHEAD
SKIPL2OUT = (SKIPL2-B and MATCH-B and not SKIPAtmp) or (SKIPL2-A and MATCH-A and not STARTL2-B)
STARTL2OUT = STARTL2-B or STARTL2-A

TERMINAL MASK GENERATOR
MASKL1-A = SKIPL1-A and MATCH-A
MASKL1-B = SKIPL1-B and MATCH-B or (MASKL1-A and not STARTL1-B)
MASKL1-C = SKIPL1-C and MATCH-C or (SKIPL1-OUT and not STARTL1-C)
MASKL1-D = SKIPL1-D and MATCH-D or (MASKL1-C and not STARTL1-D)

MASKL2-A = (SKIPL2-A and MATCH-A)
MASKL2-B = (SKIPL2-B and MATCH-B and not MASKL1-B) or (MASKL2-A and not STARTL2-B)
MASKL2-C = (SKIPL2-C and MATCH-C and not MASKL1-C) or (SKIPL2OUT and not STARTL2-C)
MASKL2-D = (SKIPL2-D and MATCH-D and not MASKL1-D) or (MASKL2-C and not STARTL2-D)

FIGURE 5C

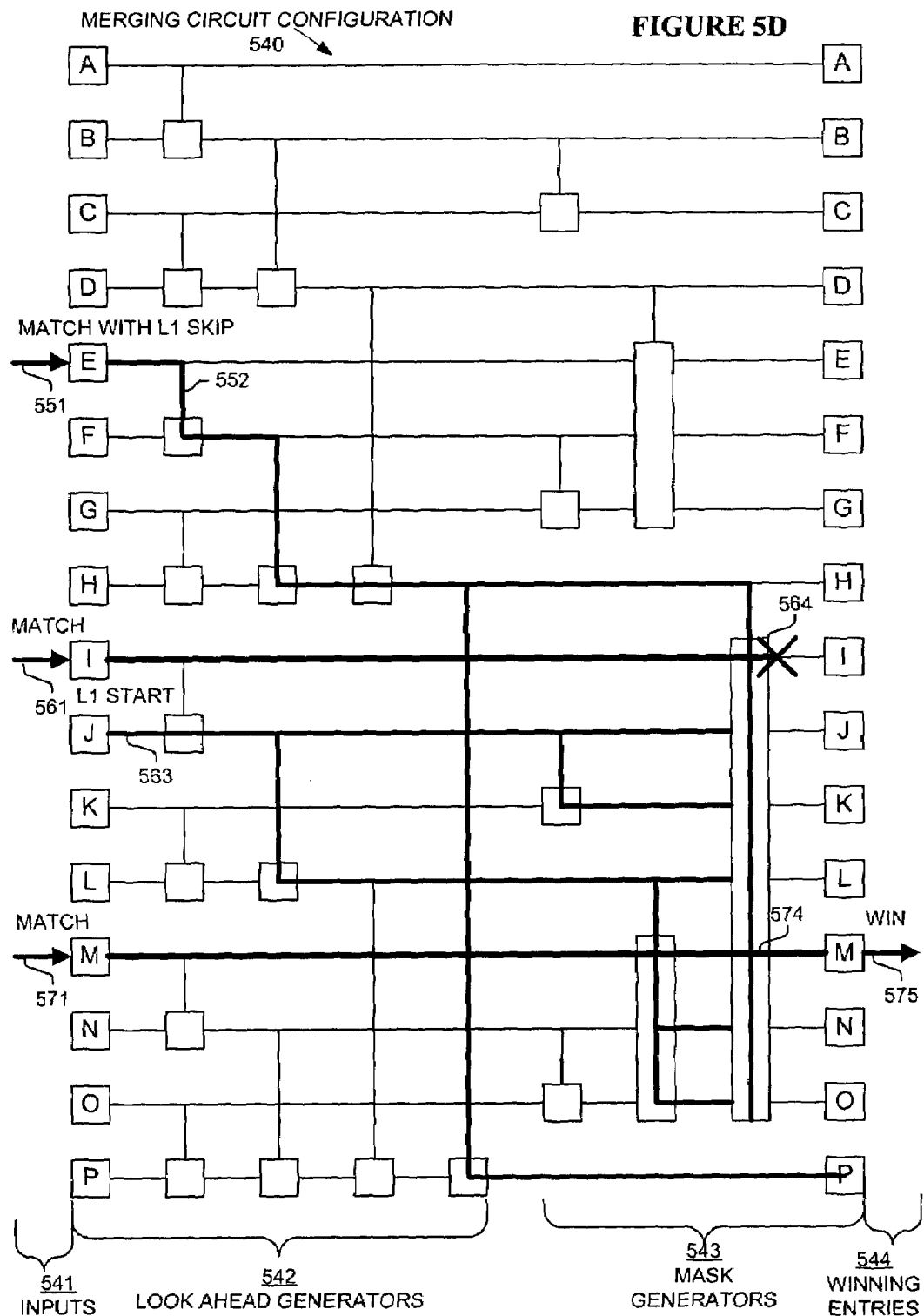

MERGING INDICATIONS OF MATCHING ITEMS OF MULTIPLE GROUPS AND POSSIBLY ASSOCIATED WITH SKIP CONDITIONS TO IDENTIFY WINNING ENTRIES OF PARTICULAR USE FOR IMPLEMENTING ACCESS CONTROL LISTS

TECHNICAL FIELD

One embodiment of the invention relates to communications and computer systems, especially routers, packet switching systems, and other devices; and more particularly, one embodiment relates to merging indications of matching items of multiple groups and possibly associated with skip conditions to identify winning entries of particular use for implementing access control lists.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP).

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs typically require matching packets on a subset of fields of the packet header or flow label, with the semantics of a sequential search through the ACL rules.

Access control and quality of service features are typically implemented based on programming contained in one or more ACLs. A network administrator controls access to a network using access control lists (ACLs). ACLs are very flexible and allow the network administrator to specify several conditions to be met and several actions to be taken. The syntax is such that it is most easily interpreted in a serial fashion. When an ACL entry matches a packet in a process of serially evaluating an ACL in a known system, one of the actions that may be required is to skip over a certain number of subsequent ACL entries before resuming the serial evaluation. When implemented by a software program, a serial interpretation is quite natural, however, the number of packets per second that can be processed is limited.

In high performance network switches, a ternary content addressable memory (TCAM) is commonly used to increase the number of packets per second that can be processed as it allows lookup operations to be performed in parallel on numerous entries corresponding to ACL actions. However, the performance advantage of a TCAM is only available if all entries are evaluated at once and a TCAM chip can only provide the address of the first matching entry.

So, to implement features in hardware in which more than one matching condition can be specified, these multiple ACL lists are typically combined into one list using a software merge transformation which can be used for programming and associative memory. Various techniques are known for combining these items, such as Binary Decision Diagram (BDD) and Order Dependent Merge (ODM). For example, if there are two ACLs A (having entries A1 and A2) and B (having entries B1 and B2), then ODM combines these original lists to produce one of two cross-product equivalent ordered lists, each with four entries: A1B1, A1B2, A2B1, and A2B2; or A1B1, A2B1, A1B2, and A2B2. These four entries can then be programmed into an associative memory and an indication of a corresponding action to be taken placed in an adjunct memory. Lookup operations can then be performed on the associative and adjunct memories to identify a corresponding action to use for a particular packet being processed. There are also variants of ODM and BDD which may filter out the entries which are unnecessary as their values will never allow them to be matched.

However, these software merge techniques can cause each ACL entry to consume multiple entries in the TCAM. If this memory usage expansion could be avoided, a smaller, less expensive TCAM could be used or, for the same size TCAM, larger ACLs could be supported.

SUMMARY

Disclosed are, inter alia, methods, apparatus, data structures, computer-readable medium, mechanisms, and means for merging indications of matching items of multiple groups and possibly associated with skip conditions to identify winning entries of particular use for implementing access control lists, which may be of particular use in routers, packet switching systems, and other devices. In one embodiment, indications are received from an associative memory bank indicating which locations were matched during a lookup operation. Each of the entries is typically associated with one or more hierarchical groups and a skip or no-skip condition. The matching entries are merged to identify one or more wining entries, these being matching entries not in a group that is skipped. A group is typically skipped if the highest priority matching entry of the particular group is associated with a skip condition. A priority encoder can be used to identify a single highest priority winning entry from the winning entries.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIGS. 4A–B are block diagrams illustrating merging of entries used in one embodiment;

FIGS. 5A–C are a block diagrams illustrating merging of entries used in one embodiment;

FIG. 5D is a block diagram of a merging circuit configuration used in one embodiment;

DETAILED DESCRIPTION

Figure 1A:
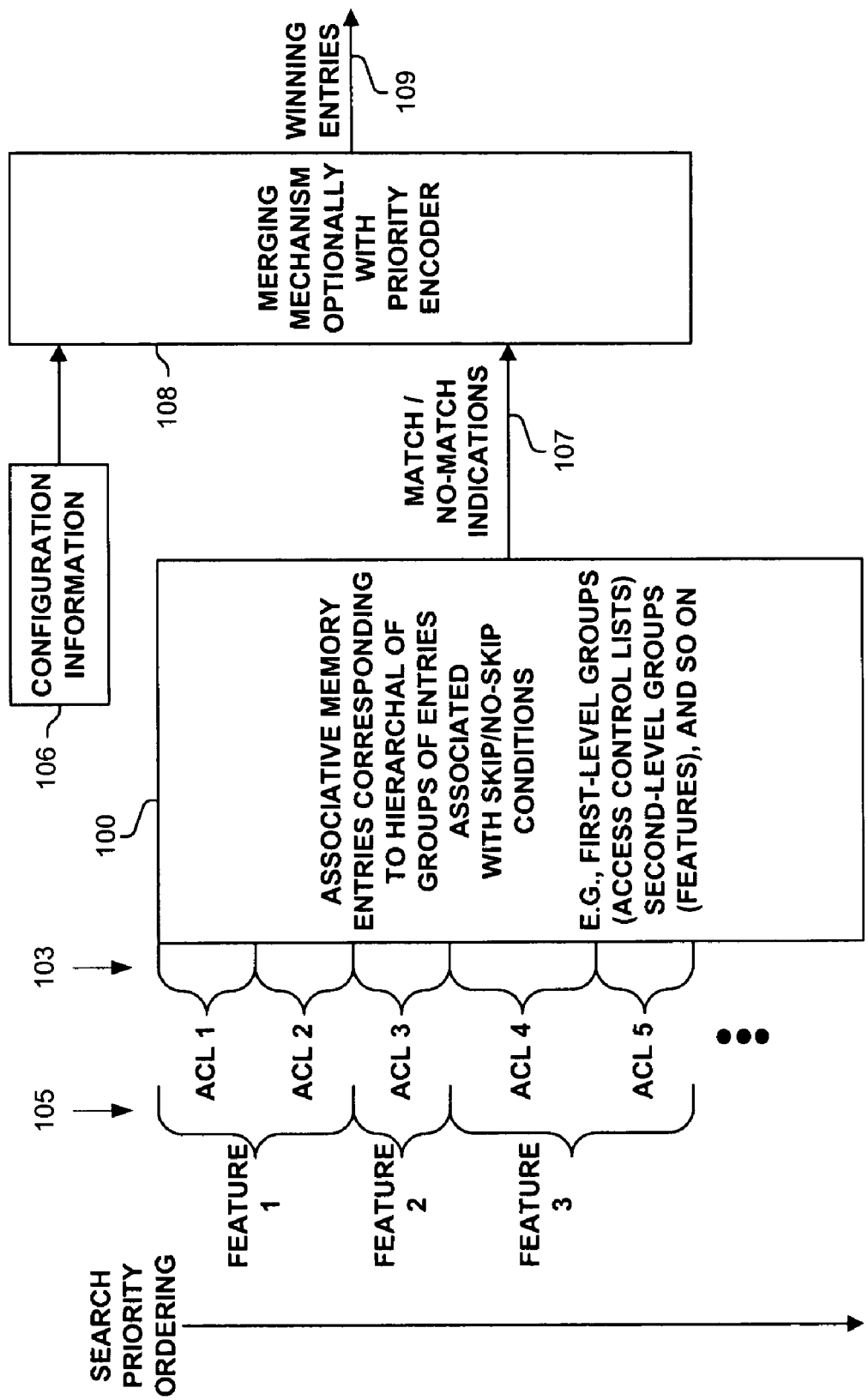
FIG. 1A is a block diagram illustrating a system used in one embodiment for merging indications of matching items of multiple groups and possibly associated with skip conditions to identify winning entries.

Disclosed are, inter alia, methods, apparatus, data structures, computer-readable medium, mechanisms, and means for merging indications of matching items of multiple groups and possibly associated with skip conditions to identify winning entries of particular use for implementing access control lists, which may be of particular use in routers, packet switching systems, and other devices.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable medium containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or identification of a packet. Moreover, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may be performed in the same or in a different serial or parallel ordering and/or by different components and/or processes, threads, etc., and/or over different connections and be combined with other functions in other embodiments in keeping within the scope and spirit of the invention. Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications mediums or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, and/or storage mechanism. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value. etc. The term "associative memory" is an extensible term, and refers to all types of known or future developed associative memories, including, but not limited to binary and ternary content addressable memories, hash tables, TRIE and other data structures, etc. Additionally, the term "associative memory unit" may include, but is not limited to one or more associative memory devices or parts thereof, including, but not limited to regions, segments, banks, pages, blocks, sets of entries, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items.

Disclosed are, inter alia, methods, apparatus, data structures, computer-readable medium, mechanisms, and means for merging indications of matching items of multiple groups and possibly associated with skip conditions to identify winning entries of particular use for implementing access control lists. In one embodiment, indications are received from an associative memory bank indicating which locations were matched during a lookup operation. Each of the entries is typically associated with one or more hierarchical groups and a skip or no-skip condition. The matching entries are merged to identify one or more wining entries, these being matching entries not in a group that is skipped. A group is typically skipped if the highest priority matching entry of the particular group is associated with a skip condition. A priority encoder can be used to identify a single highest priority winning entry from the winning entries.

One embodiment includes an associative memory bank which generates matching indication signals for each matching entry that matches a lookup value. A merging mechanism is used to identifying a winning entry or multiple winning entries, if any, from the entries identified as matching. Each of the associative memory entries is associated with one or more hierarchical groups and a skip or a no-skip condition. The merging mechanism selects a winning entry based on the matching indication signals from the associative memory. This selecting typically includes identifying as a winning entry an entry first in the priority ordering of the entries that is not in a group that is skipped, wherein a particular group is skipped if the highest priority matching entry of the particular group is associated with a skip condition.

One embodiment includes one or more banks of one or more storage elements for identifying for each entry: (a) the associated skip or no-skip condition, and (b) whether or not said particular entry is first in the order sequence of one of the ordered plurality of groups. In one embodiment, each group corresponds to a different access control list. In one embodiment, the merging mechanism includes circuitry for identifying and masking skipped entries of the matching entries.

FIG. 1A is a block diagram illustrating a system used in one embodiment for merging indications of matching items of multiple groups and possibly associated with skip conditions to identify winning entries. Associative memory entries 100 typically correspond to two or more groups of entries, and each entry is typically associated with a skip/no-skip condition. As shown, entries 100 correspond to multiple access control lists 103 (e.g., first-level groups of entries) and also different features 105 (e.g., second-level groups of entries). These associations are provided to merging mechanism 108 as indicated by configuration information 106 (e.g., storage devices, received signals, etc.). Associative memory entries 100 are matched against a lookup value and generates match/no-match indications 107. These are typically parallel signals (e.g., one high or low signal for each entry indicating a match or no match), but may be any signaling or communications mechanism. Merging mechanism 108 identifies one or more winning entries 109 based on match/no-match indications 107 and configuration information 106. In one embodiment, merging mechanism 108 includes a priority encoder or other mechanism to identify a single, highest-priority winning entry 109.

In one embodiment, merging mechanism 108 identifies as the winning entry a matching entry first in the priority ordering of the entries that is not in a group that is skipped, wherein a particular group is skipped if the highest priority matching entry of the particular group is associated with a skip condition. In one embodiment, merging mechanism 108 identifies as the winning entry an entry first in the priority ordering that is not in one of the hierarchical groups that is skipped. One embodiment supports two levels of hierarchical groups; while one embodiment supports more than two levels of hierarchical groups with the exact number of levels being determined typically based on the needs of a particular application using an embodiment.

Figure 1B:
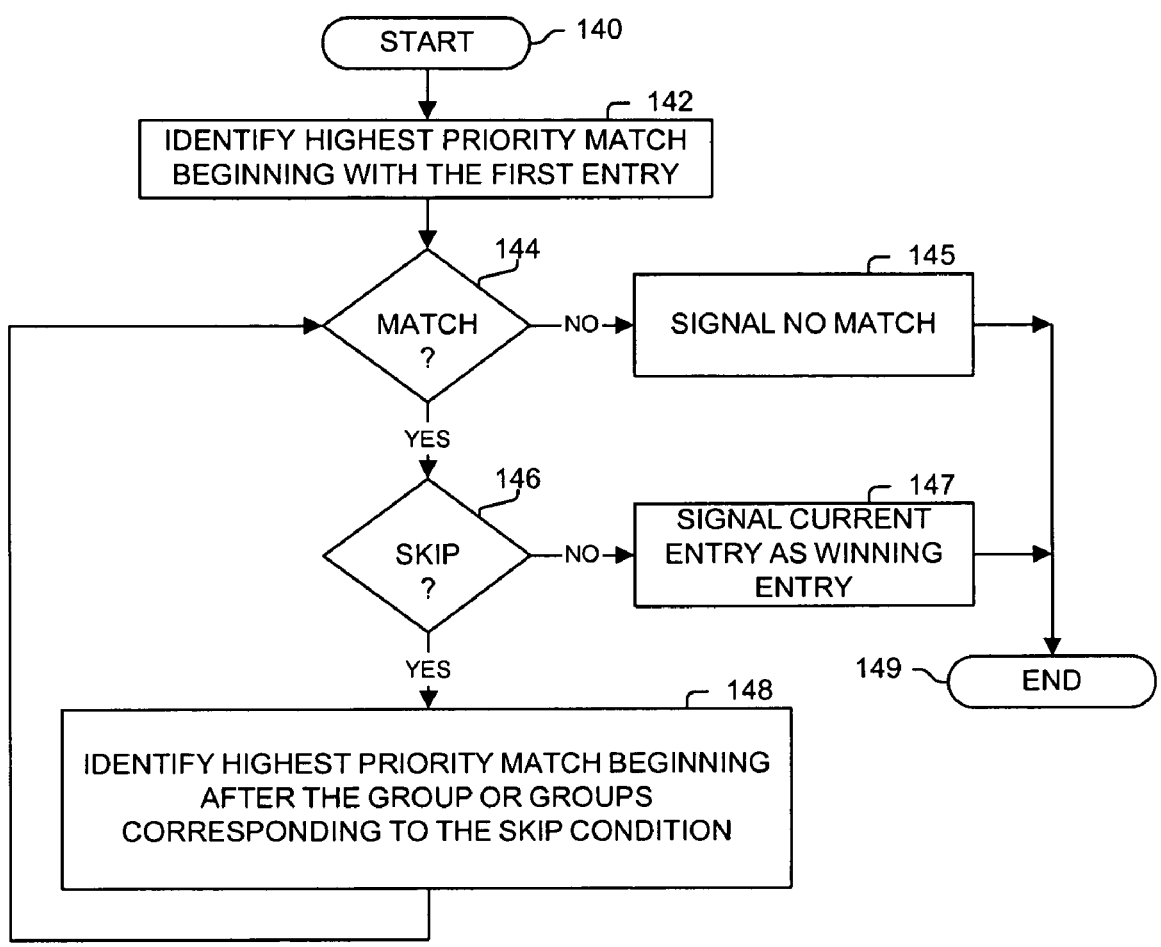
FIG. 1B is a flow diagram illustrating a process for identifying a winning entry used in one embodiment.

FIG. 1B is a flow diagram illustrating a process for identifying a winning entry used in one embodiment. Processing begins with process block 140, and proceeds to process block 142, wherein a highest priority match beginning from the first entry is identified. Next, as determined in process block 144, if there was no matching entry identified, then processing proceeds to process block 145, wherein a signal indicating no match is generated, and processing of this flow diagram is complete as indicated by process block 149. Otherwise, as determined in process block 146, if the identified matching entry is associated with a skip condition, then in process block 148, the next highest priority matching entry is identified from a next group that is not associated with the skip condition, and processing returns to process block 144. In one embodiment, an entry is associated with a single skip operation. In one embodiment, an entry is associated with multiple skip operations. Otherwise, processing proceeds from process block 146 to process block 147, wherein the current entry is identified as a winning entry, and processing of the flow diagram is complete as indicated by process block 149.

Figure 2A:
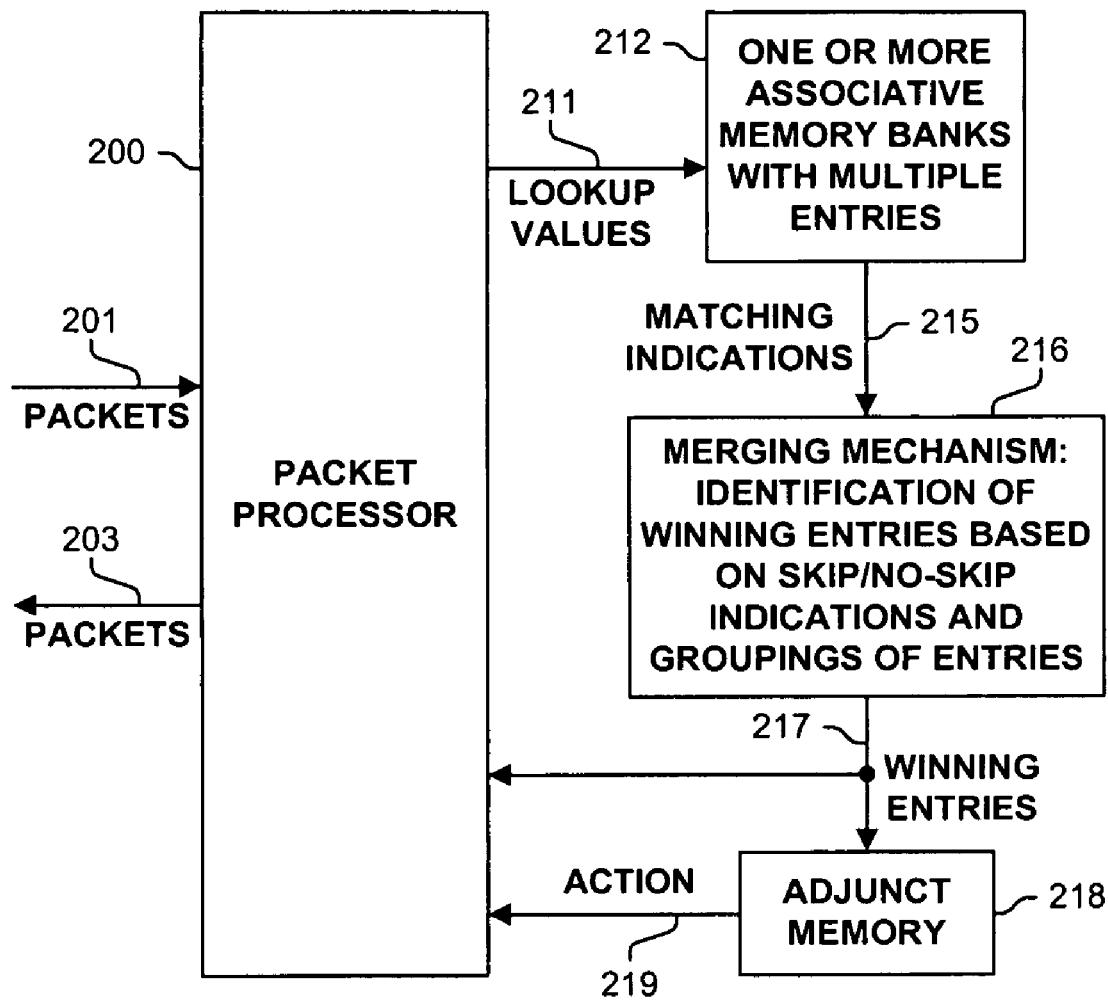
FIG. 2A is a block diagram of a system for identifying winning entries used in one embodiment.

FIG. 2A is a block diagram of a system for identifying winning entries used in one embodiment. Packet processor 200 receives a packets 201 and generates lookup values 211. For each lookup value 211, a lookup operation is performed in one or more associative memory banks 212, each having multiple entries. Matching indications 215 are generated, which are used by merging mechanism 216 along with skip/no-skip and group indications to identify one or more winning entries 217. These winning entries 217 can be used by packet processor 200 directly, or may be used to perform a lookup operation in adjunct memory 218 to identify an action 219. Packet processor accordingly manipulates one or more of the received packets 201 accordingly, which may include forwarding one or more packets as indicated by packets 203.

Figure 2B:
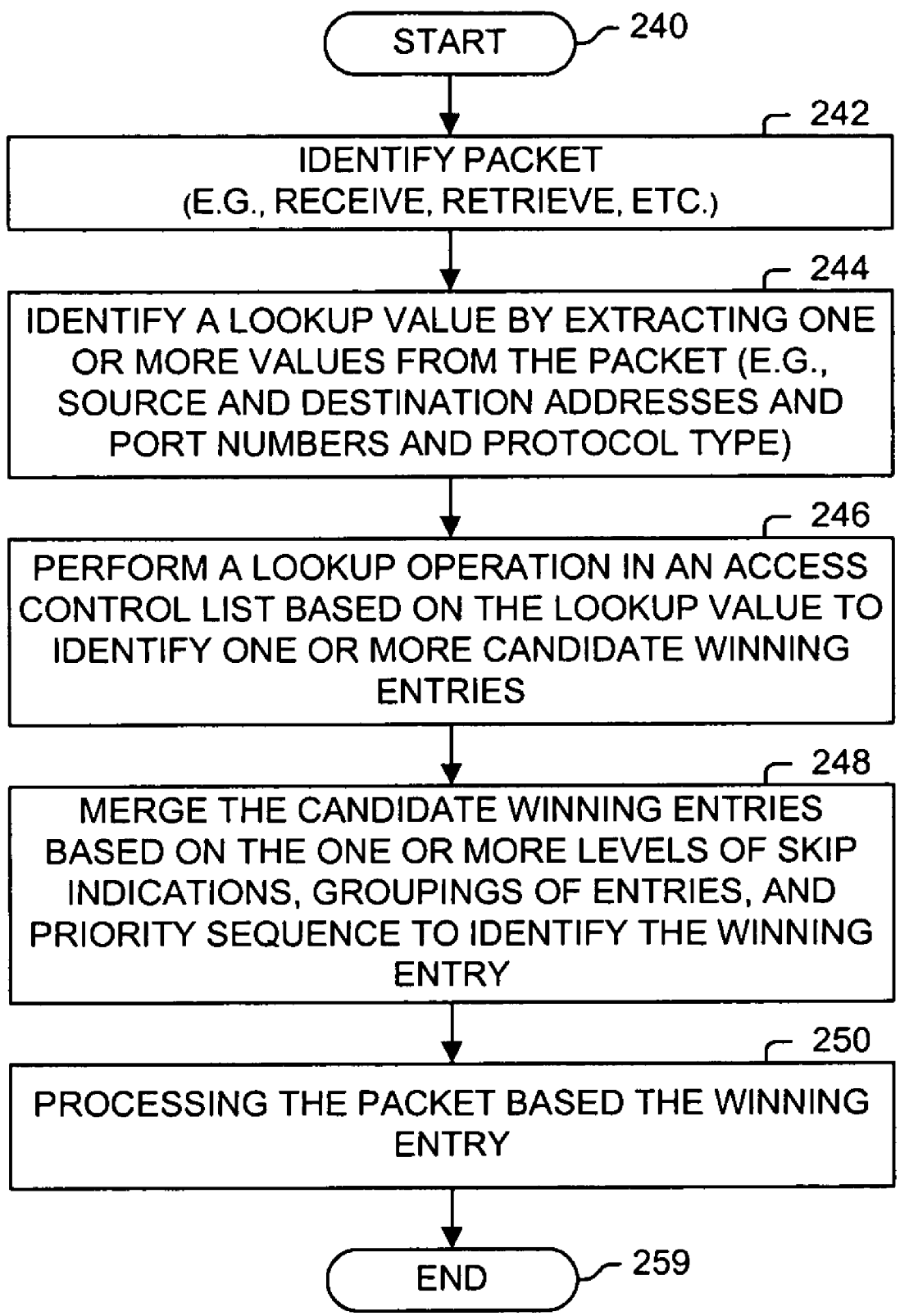
FIG. 2B is a flow diagram illustrating a process for processing packets used in one embodiment.

FIG. 2B is a flow diagram illustrating a process for processing packets used in one embodiment. Processing begins with process block 240, and proceeds to process block 242, wherein a packet is received. In process block 242, a lookup value is identified by extracting one or more values (e.g., source address, destination address, source port, destination port, protocol type, etc.) from the received packet. In process block 246, a lookup operation is performed in an access control list based on the lookup value to identify one or more candidate winning entries. In process block 248, the candidate winning entries are merged based on one or more levels of associated skip/no-skip conditions and hierarchical groupings and the priority ordering of the candidate winning entries to identify the winning entry. In process block 250, the packet is processed based on the winning entry. Processing of the flow diagram is complete as indicated by process block 259.

Figure 3A:
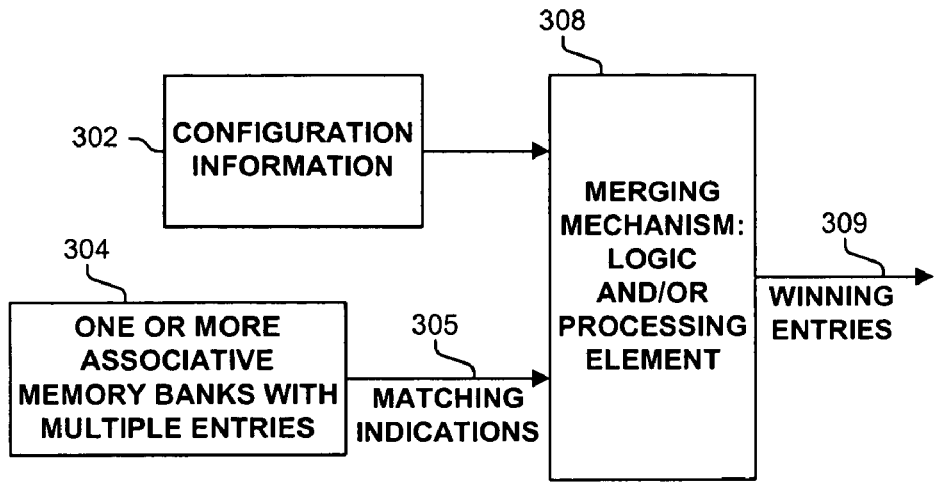
FIG. 3A is a block diagram illustrating a system used in one embodiment for merging indications of matching items of multiple groups and possibly associated with skip conditions to identify winning entries.

FIG. 3A is a block diagram illustrating a system used in one embodiment for merging indications of matching items of multiple groups and possibly associated with skip conditions to identify winning entries. Merging mechanism 308 (e.g., logic and/or processing element) receives configuration information 302 and matching indications 305 from one or more associative memory banks with multiple entries 304. Based on the received information, merging mechanism 308 generates an indication of one or more winning entries 309.

Figure 3B:
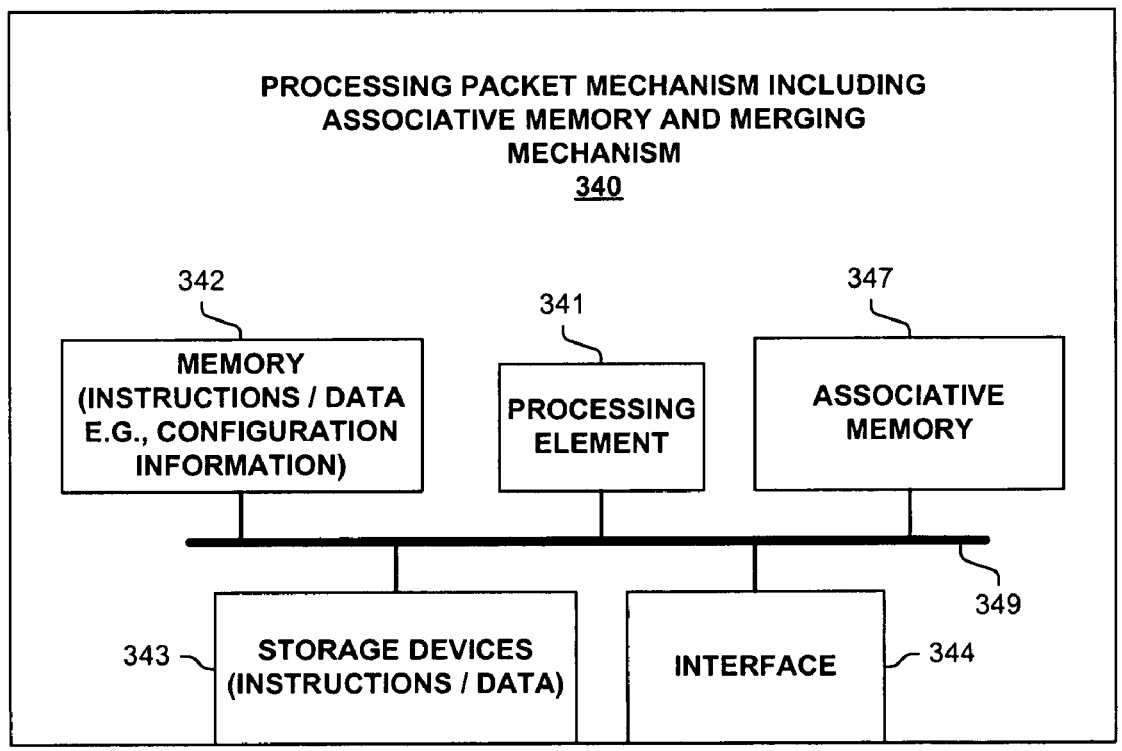
FIG. 3B is a block diagram illustrating a system used in one embodiment for merging indications of matching items of multiple groups and possibly associated with skip conditions to identify winning entries.

FIG. 3B is a block diagram illustrating a system 340 used in one embodiment for merging indications of matching items of multiple groups and possibly associated with skip conditions to identify winning entries. For example, one embodiment includes a process corresponding to one of the block or flow diagrams illustrated herein, or corresponding to any other means or mechanism implementing all or part of a claim with other internal or external components or devices possibly implementing other elements/limitations of a claim. Additionally, a single or multiple systems, devices, components, etc. may comprise an embodiment.

In one embodiment, system 340 includes a processing element 341, memory 342, storage devices 343, an interface 344 for receiving and transmitting packets or other items, and an associative memory 347, which are coupled via one or more communications mechanisms 349 (shown as a bus for illustrative purposes). In one embodiment, a packet is received via interface 344. Processing element 341 generates a lookup value upon which associative memory 347 performs a lookup operation to identify multiple candidate winning entries. Processing element them merges these multiple candidate winning entries based on configuration information retrieved from memory 342 or storage devices 343 to identify a winning entry (or possibly multiple winning entries depending on the embodiment, candidate winning entries and configuration information).

Various embodiments of system 340 may include more or less elements. The operation of system 340 is typically controlled by processing element 341 using memory 342 and storage devices 343 to perform one or more tasks or processes, such as, but not limited to identifying a winning entry and processing packets based thereon. One embodiment uses another lookup mechanism rather than associative memory 347 to perform the lookup operation on the access control lists or other entries.

Memory 342 is one type of computer-readable medium, and typically comprises random access memory (RAM), read only memory (ROM), flash memory, integrated circuits, and/or other memory components. Memory 342 typically stores computer-executable instructions to be executed by processing element 341 and/or data which is manipulated by processing element 341 for implementing functionality in accordance with one embodiment of the invention. Storage devices 343 are another type of computer-readable medium, and typically comprise solid state storage media, disk drives, diskettes, networked services, tape drives, and other storage devices. Storage devices 343 typically store computer-executable instructions to be executed by processing element 341 and/or data which is manipulated by processing element 341 for implementing functionality in accordance with one embodiment of the invention.

Figure 4A:
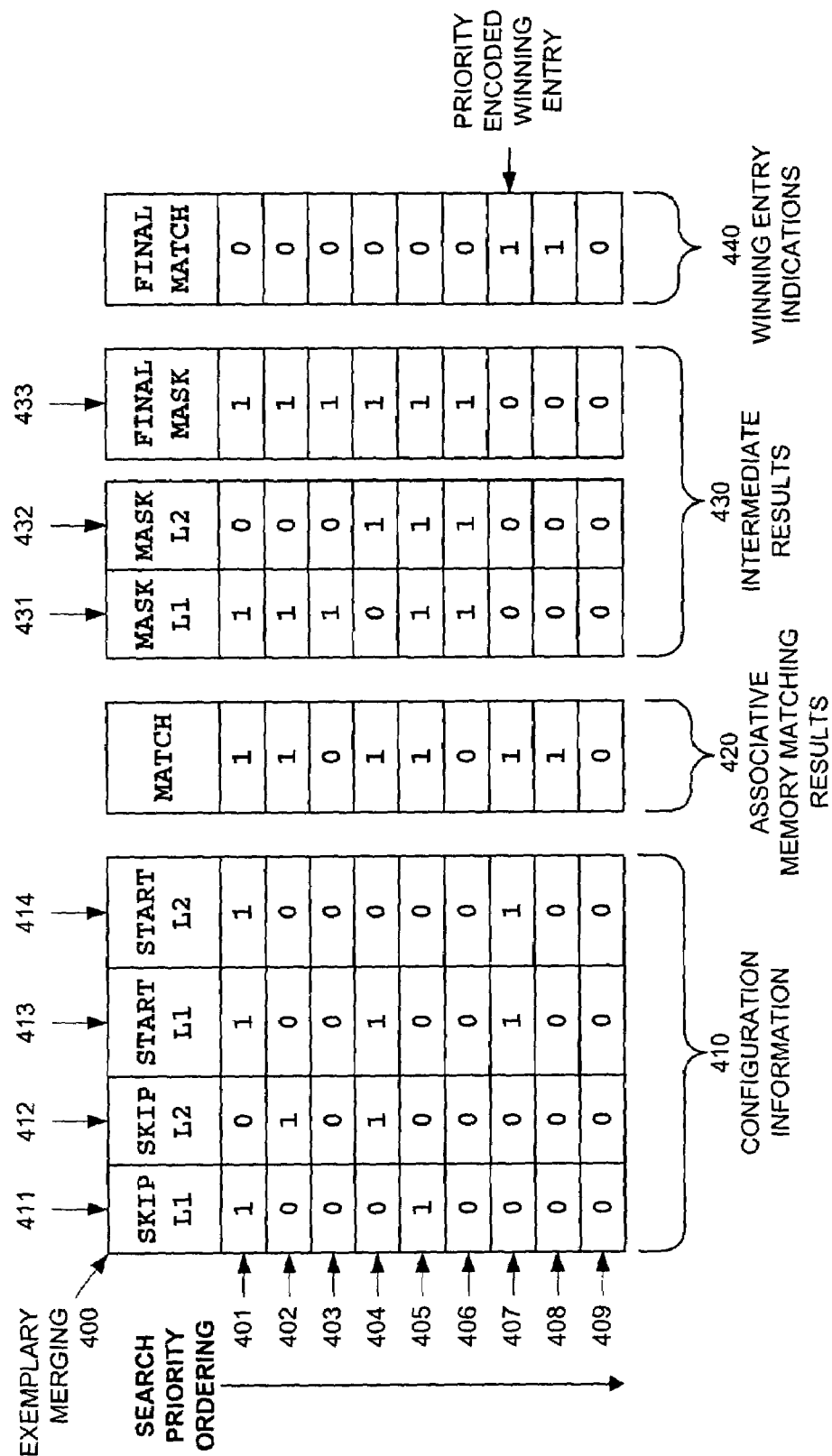
Figures 4B, 5A:
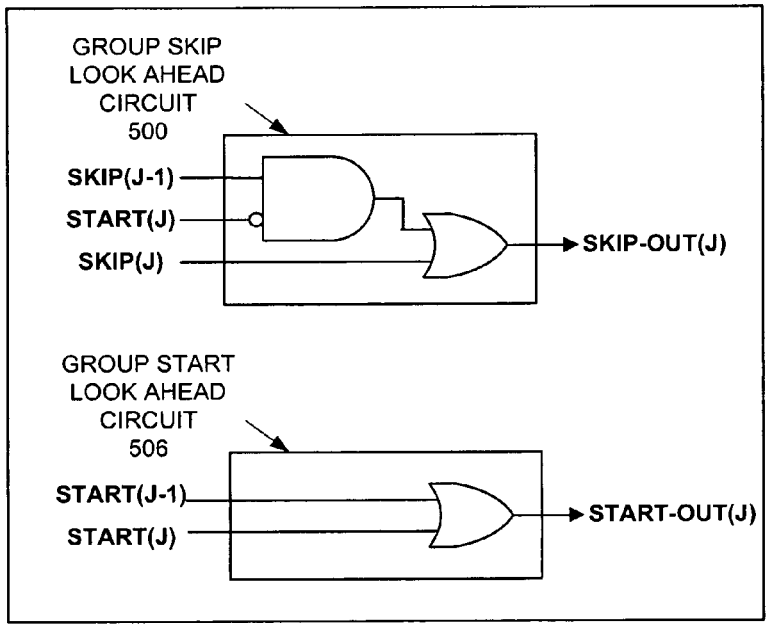

FIGS. 4A–B are block diagrams illustrating merging of entries used in one embodiment. FIG. 4A illustrates exemplary merging 400 performed in one embodiment for entries 401–409. Bit vector 411 indicates which entries 401–409 are associated with a skip condition (i.e., a '1') and a no-skip condition (i.e., a '0') for a level-one group, and bit vector 412 illustrates skip/no-skip conditions for a level-two group. Bit vector 413 indicates which entries 401–409 are associated with which level-one group (i.e., a '1' indicates a first entry of a group, and bit vector 414 illustrates groupings for a level-two group. Bit vector 420 indicates for this example, which entries matched a lookup word (e.g., via a lookup operation on an associative memory bank). Note, the term "bit vector" is used herein is not limiting of the mechanisms or methods used to communicate configuration information, candidate winning entries and/or other information to or from a merging mechanism.

Based on configuration information 410 (i.e., bit vectors 411–414) and associative memory matching results (i.e., bit vector 420), a merging mechanism generate intermediate results 430. Bit vector 431 indicates with a "1" which entries 401–409 should be skipped (e.g., entries 401 and 405 are matched and are associated with a skip L1 condition) and bit vector 432 indicates with a "1" which entries 401–409 should be skipped (e.g., entries 402 and 404 are matched and are associated with a skip L2 condition). Final mask 433 is the result of an or-operation on mask L1 431 and mask L2 432, and final match/winning entry indications 440 can be determined by an and-operation on match bit vector 420 and final mask 433. One embodiment forwards zero, one or more than one winning entry indications 440; while one embodiment forwards zero or one winning entry indication 440 (i.e., the final match entry first in the search priority order readily determined by a priority encoder or other mechanism).

FIG. 4B illustrates exemplary merging logic equations 460 used in one embodiment. As illustrated, one embodiment uses a daisy chain serial method for identifying the masks to be used for L1 and L2 groupings when L1 and L2 skip conditions are respectively identified. In one embodiment, multiple levels of skip operations are not associated with a single entry, so some simplification of the logic to identify the masks is possible.

Figure 5B:
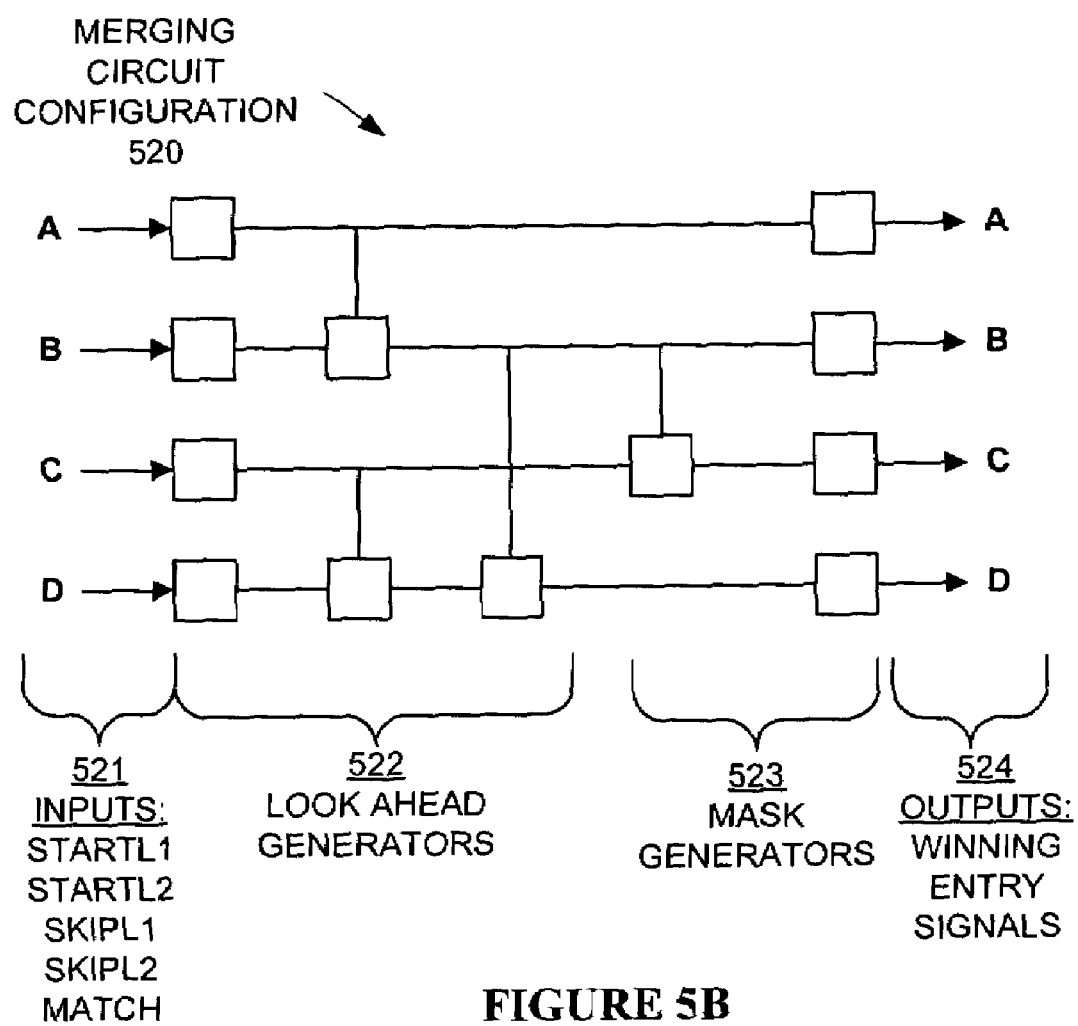

FIGS. 5A–C are a block diagrams illustrating merging of entries used in one embodiment. As shown, the identification of the winning entries can be performed using a look head propagation method to shorten the time required to identify the winning entry or entries.

FIG. 5A illustrates a group skip look ahead circuit 500, which generates a skip-out signal for a current element based on the skip signal generated by a previous element, and the current elements configuration information (i.e., its associated start and skip information). Group start look ahead circuit 506 generates a start-out signal for a current element based on the start-out signal generated for the previous element and its configuration information (i.e., its associated start information).

FIG. 5B illustrates how these group skip look ahead circuits 500 and group start look ahead circuits 506 can be combined into a merging circuit configuration 520 for identify winning entries 524. In this example, merging circuit configuration 520 operates on four elements (A–D) and two levels of group hierarchy. Of course, embodiments are extensible to the number of inputs and levels of groups required for a particular application.

Merging circuit 520 receives as input configuration information for each of the elements, including STARTL1 AND STARTL2 information for identifying groups to which an element belongs. In one embodiment, a different mechanism is used to identify which group or groups an element belongs, such as, but not limited to a value for each group it belongs and not just if it is the first element of the group (and the logic equations are adapted to fit the format of the configuration information). Additionally, merging circuit receives indications of which elements matched and if these are associated with skip conditions, and if so, which group level to skip. In one embodiment, match and skip information for each level is received for each lookup operation and used in performing the merging of the entries in identifying one or more winning entries.

Merging circuit 520 uses a sequence of look ahead generators 522 followed by mask generators 523 to identifying winning entries 524. FIG. 5C illustrates exemplary logic equations 530 for look ahead generators 522 and mask generators 523. Merging circuit 520 propagates a skip for a group level until it hits a start for the same group level, and group starts are propagated forever. Mask generators 523 use the look ahead signals from look ahead generators 522 along with inputs 521 to generate outputs 524.

In the four input example illustrated in FIG. 5B, the outputs of the look ahead generators 522 for four inputs are generated with only two levels of logic. In general, for any number of inputs N (which is a power of 2), the levels of logic required will be log2(N). More inputs are supported by expanding the network in a structured way. For example, a network which handles sixteen inputs is illustrated in FIG. 5D.

FIG. 5D is a block diagram of a merging circuit configuration 540 used in one embodiment for sixteen entries. Merging circuit 540 operates in the same manner as that of merging circuit 520 (FIG. 5B) and is adapted to handle the additional entries. Merging circuit 540 will be used to illustrate how look ahead generators 542 and mask generators 543 operate on inputs 541 (e.g., matching information) and predetermined configuration information (e.g., group and skip information) to generate winning entries 544. Note, in one embodiment, inputs 541 includes matching, skip, and grouping information; while in one embodiment, inputs 541 a subset thereof.

As shown, three successful matches (551, 561, and 571) are received by merging circuit 540. The highest priority matching element corresponds to match 551, which is associated with a skip operation (otherwise, it would be identified as a winning entry 544). A corresponding skip signal 552 propagates through circuit 540 as shown. Match indication 561 is blocked (as indicated by reference number 564) based on skip signal 552. An level one start signal 563 corresponding to element J is generated and propagates through circuit 540 as shown. Matching indicator 571 propagates through circuit 540 as shown. However, based on L1 start signal 563, match indication 571 is allowed to pass (i.e., is not blocked) by L1 skip signal 552 at position 574, and thus, winning entry indication 575 is generated.

Figure 6A:
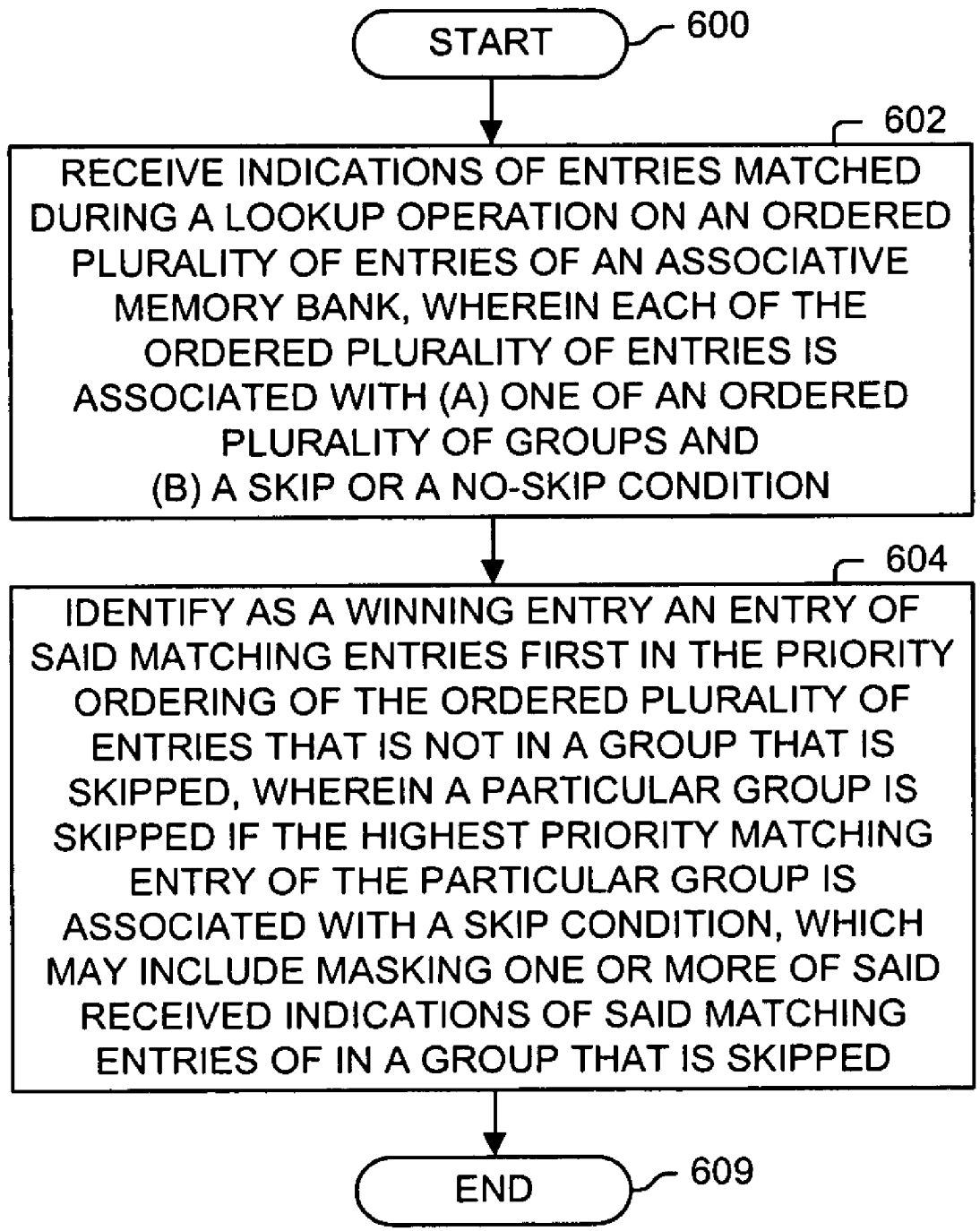
FIGS. 6A is a flow diagram illustrating a process for identifying a winning entry used in one embodiment.

FIGS. 6A is a flow diagram illustrating a process for identifying a winning entry used in one embodiment. Processing begins with process block 600, and proceeds to process block 602, wherein indications of entries matched during a lookup operation on an ordered plurality of entries of an associative memory bank are received, wherein each of the ordered plurality of entries is associated with (a) one of an ordered plurality of groups and (b) a skip or a no-skip condition. In process block 604, an entry of the matching entries first in the priority ordering of the ordered plurality of entries that is not in a group that is skipped is identified as a winning entry. A particular group is skipped if the highest priority matching entry of the particular group is associated with a skip condition, which may include masking one or more of the received indications of the matching entries of in a group that is skipped. Processing of the flow diagram is complete as indicted by process block 609.

Figure 6B:
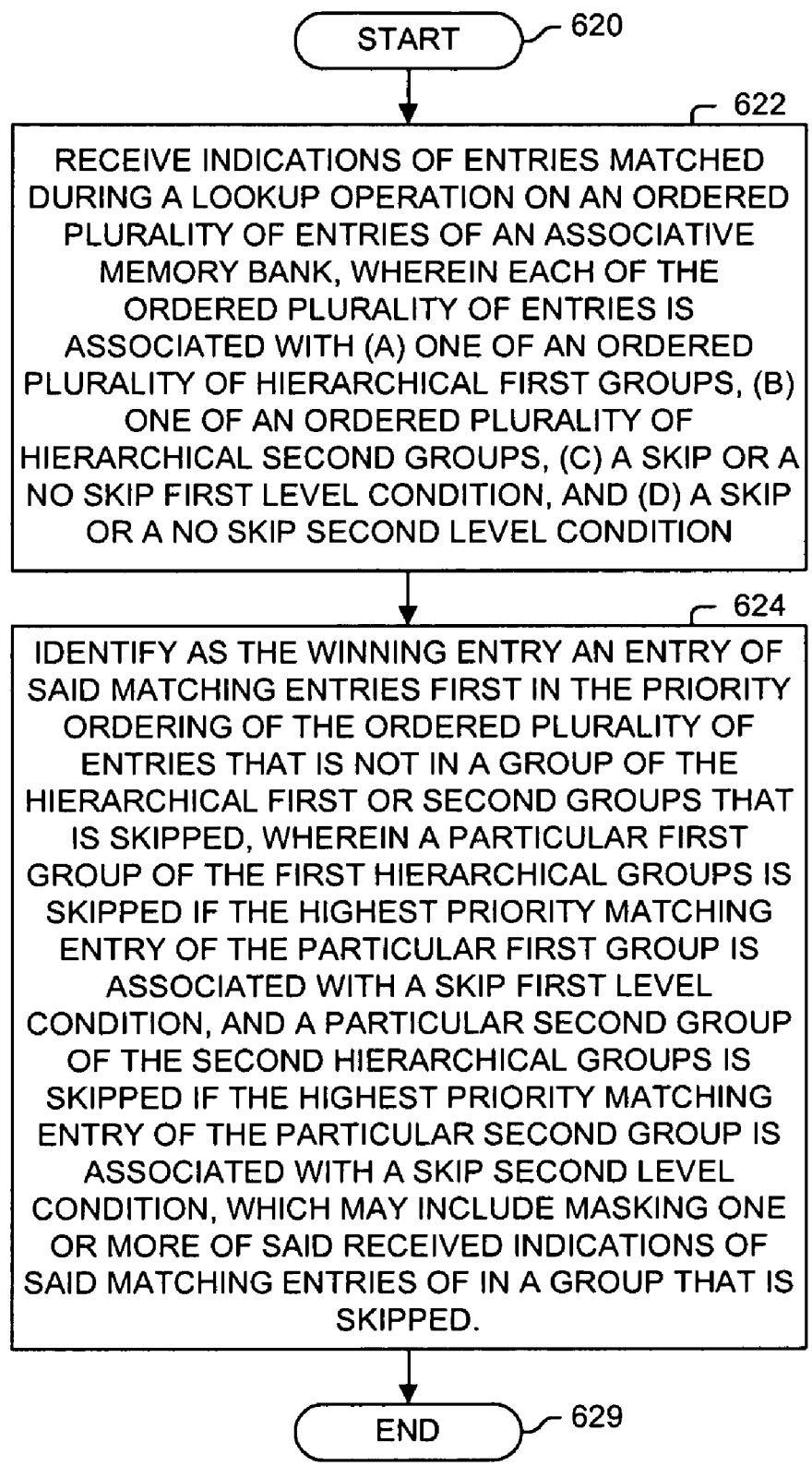
FIG. 6B is a flow diagram illustrating a process for identifying a winning entry used in one embodiment.

FIG. 6B is a flow diagram illustrating a process for identifying a winning entry used in one embodiment. Processing begins with process block 620, and proceeds to process block 622, wherein indications of entries matched during a lookup operation on an ordered plurality of entries of an associative memory bank are received, wherein each of the ordered plurality of entries is associated with (a) one of an ordered plurality of hierarchical first groups, (b) one of an ordered plurality of hierarchical second groups, (c) a skip or a no skip first level condition, and (d) a skip or a no skip second level condition. In process block 624, an entry of the matching entries first in the priority ordering of the ordered plurality of entries that is not in a group of the hierarchical first or second groups that is skipped is identified as the winning entry, wherein a particular first group of the first hierarchical groups is skipped if the highest priority matching entry of the particular first group is associated with a skip first level condition, and a particular second group of the second hierarchical groups is skipped if the highest priority matching entry of the particular second group is associated with a skip second level condition, which may include masking one or more of the received indications of the matching entries of in a group that is skipped. Processing of the flow diagram is complete as indicted by process block 629.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus for identifying matching items, the apparatus comprising:
   an associative memory bank, including an ordered plurality of entries, for generating matching indication signals for each matching entry of the ordered plurality of entries that matches a lookup value; and
   a merging mechanism, coupled to the matching mechanism, for identifying a winning entry from said matching entries, wherein each of the ordered plurality of entries is associated with (a) one of an ordered plurality of groups and (b) a skip or a no-skip condition, and wherein the merging mechanism selects the winning entry based on said matching indication signals; wherein said selecting the winning entry includes identifying as the winning entry an entry of said matching entries first in the priority ordering of the ordered plurality of entries that is not in a group that is skipped, wherein a particular group is skipped if the highest priority matching entry of the particular group is associated with a skip condition.

2. The apparatus of claim 1, comprising one or more banks of one or more storage elements for identifying for each particular entry of the plurality of entries: (a) the associated skip or no-skip condition, and (b) whether or not said particular entry is first in the order sequence of one of the ordered plurality of groups.

3. The apparatus of claim 1, wherein each of the plurality of groups corresponds to a different access control list.

4. The apparatus of claim 1, wherein the merging mechanism includes circuitry for identifying and masking skipped entries of said matching entries.

5. An apparatus for identifying matching items, the apparatus comprising:
   an associative memory bank, including an ordered plurality of entries, for generating matching indication signals for each matching entry of the ordered plurality of entries that matches a lookup value; and
   a merging mechanism, coupled to the matching mechanism, for identifying a winning entry from said matching entries, wherein each of the ordered plurality of entries is associated with (a) one of an ordered plurality of hierarchical first groups, (b) one of an ordered plurality of hierarchical second groups, (c) a skip or a no-skip first-level condition, and (d) a skip or a no-skip second-level condition, and wherein the merging mechanism selects the winning entry based on said matching indication signals; wherein said selecting the winning entry includes identifying as the winning entry an entry of said matching entries first in the priority ordering of the ordered plurality of entries that is not in a group of the hierarchical first or second groups that is skipped, wherein a particular first group of the first hierarchical groups is skipped if the highest priority matching entry of the particular first group is associated with a skip first-level condition, and a particular second group of the second hierarchical groups is skipped if the highest priority matching entry of the particular second group is associated with a skip second-level condition.

6. The apparatus of claim 5, comprising one or more banks of one or more storage elements for identifying for each particular entry of the plurality of entries: (a) the associated skip or no-skip first-level condition, (b) the associated skip or no-skip second-level condition, (c) whether or not said particular entry is first in the order sequence of one of the ordered plurality of hierarchical first groups, and (c) whether or not said particular entry is first in the order sequence of one of the ordered plurality of hierarchical second groups.

7. The apparatus of claim 5, wherein each of the plurality of groups corresponds to a different access control list.

8. The apparatus of claim 5, wherein the merging mechanism includes circuitry for identifying and masking skipped entries of said matching entries.

9. A method for identifying matching items, the method comprising:
   receiving indications of entries matched during a lookup operation on an ordered plurality of entries of an associative memory bank, wherein each of the ordered plurality of entries is associated with (a) one of an ordered plurality of groups and (b) a skip or a no-skip condition; and
   identifying as a winning entry an entry of said matching entries first in the priority ordering of the ordered plurality of entries that is not in a group that is skipped, wherein a particular group is skipped if the highest priority matching entry of the particular group is associated with a skip condition.

10. The method of claim 9, wherein said identifying as the winning entry includes masking one or more of said received indications of said matching entries of in a group that is skipped.

11. An apparatus for identifying matching items, the apparatus comprising:
    means for receiving indications of entries matched during a lookup operation on an ordered plurality of entries, wherein each of the ordered plurality of entries is associated with (a) one of an ordered plurality of groups and (b) a skip or a no-skip condition; and
    means for identifying as a winning entry an entry of said matching entries first in the priority ordering of the ordered plurality of entries that is not in a group that is skipped, wherein a particular group is skipped if the highest priority matching entry of the particular group is associated with a skip condition.

12. The apparatus of claim 11, wherein said means for identifying as the winning entry includes means for masking one or more of said received indications of said matching entries of in a group that is skipped.

13. A computer-readable medium containing computer-executable instructions for performing steps for identifying matching items, said steps comprising:

receiving indications of entries matched during a lookup operation on an ordered plurality of entries of an associative memory bank, wherein each of the ordered plurality of entries is associated with (a) one of an ordered plurality of groups and (b) a skip or a no-skip condition; and identifying as a winning entry an entry of said matching entries first in the priority ordering of the ordered plurality of entries that is not in a group that is skipped, wherein a particular group is skipped if the highest priority matching entry of the particular group is associated with a skip condition.

14. The computer-readable medium of claim 13, wherein said identifying as the winning entry includes masking one or more of said received indications of said matching entries of in a group that is skipped.

15. A method for identifying matching items, the method comprising:

receiving indications of entries matched during a lookup operation on an ordered plurality of entries of an associative memory bank, wherein each of the ordered plurality of entries is associated with (a) one of an ordered plurality of hierarchical first groups, (b) one of an ordered plurality of hierarchical second groups, (c) a skip or a no-skip first-level condition, and (d) a skip or a no-skip second-level condition; and identifying as the winning entry an entry of said matching entries first in the priority ordering of the ordered plurality of entries that is not in a group of the hierarchical first or second groups that is skipped, wherein a particular first group of the first hierarchical groups is skipped if the highest priority matching entry of the particular first group is associated with a skip first-level condition, and a particular second group of the second hierarchical groups is skipped if the highest priority matching entry of the particular second group is associated with a skip second-level condition.

16. The method of claim 15, wherein said identifying as the winning entry includes masking one or more of said received indications of said matching entries of in a group that is skipped.

17. An apparatus for identifying matching items, the apparatus comprising:

means for receiving indications of entries matched during a lookup operation on an ordered plurality of entries of an associative memory bank, wherein each of the ordered plurality of entries is associated with (a) one of an ordered plurality of hierarchical first groups, (b) one of an ordered plurality of hierarchical second groups, (c) a skip or a no-skip first-level condition, and (d) a skip or a no-skip second-level condition; and means for identifying as the winning entry an entry of said matching entries first in the priority ordering of the ordered plurality of entries that is not in a group of the hierarchical first or second groups that is skipped, wherein a particular first group of the first hierarchical groups is skipped if the highest priority matching entry of the particular first group is associated with a skip first-level condition, and a particular second group of the second hierarchical groups is skipped if the highest priority matching entry of the particular second group is associated with a skip second-level condition.

18. The apparatus of claim 17, wherein said means for identifying as the winning entry includes means for masking one or more of said received indications of said matching entries in a group that is skipped.

19. A computer-readable medium containing computer-executable instructions for performing steps for identifying matching items, said steps comprising:

receiving indications of entries matched during a lookup operation on an ordered plurality of entries of an associative memory bank, wherein each of the ordered plurality of entries is associated with (a) one of an ordered plurality of hierarchical first groups, (b) one of an ordered plurality of hierarchical second groups, (c) a skip or a no-skip first-level condition, and (d) a skip or a no-skip second-level condition; and identifying as the winning entry an entry of said matching entries first in the priority ordering of the ordered plurality of entries that is not in a group of the hierarchical first or second groups that is skipped, wherein a particular first group of the first hierarchical groups is skipped if the highest priority matching entry of the particular first group is associated with a skip first-level condition, and a particular second group of the second hierarchical groups is skipped if the highest priority matching entry of the particular second group is associated with a skip second-level condition.

20. The computer-readable medium of claim 19, wherein said identifying as the winning entry includes masking one or more of said received indications of said matching entries of in a group that is skipped.

* * * * *

UNITED STATES PATENT AND TRADEMARK OFFICE
CERTIFICATE OF CORRECTION

PATENT NO. : 7,080,195 B2 Page 1 of 1
APPLICATION NO. : 10/691401
DATED : July 18, 2006
INVENTOR(S) : Ngai et al.

It is certified that error appears in the above-identified patent and that said Letters Patent is hereby corrected as shown below:

Col. 5, line 10, replace " value etc." with -- value, etc. --

Signed and Sealed this

Twenty-first Day of November, 2006

JON W. DUDAS
*Director of the United States Patent and Trademark Office*